United States Patent [19]

Mukai

[11] Patent Number: 5,366,905
[45] Date of Patent: Nov. 22, 1994

[54] METHOD FOR PRODUCING CONDUCTING LAYERS FOR A SEMICONDUCTOR DEVICE

[75] Inventor: Ryoichi Mukai, Kawasaki, Japan

[73] Assignee: Fujitsu Limited, Kawasaki, Japan

[21] Appl. No.: 968,674

[22] Filed: Oct. 30, 1992

[30] Foreign Application Priority Data

Nov. 5, 1991 [JP] Japan ............... 3-288188

[51] Int. Cl.⁵ ............................................. H01L 21/00
[52] U.S. Cl. ........................................ 437/7; 437/173; 437/174; 437/188; 437/982
[58] Field of Search ............... 437/7, 982, 173, 174, 437/188, 203

[56] References Cited

U.S. PATENT DOCUMENTS

| | | | |
|---|---|---|---|
| 4,431,900 | 2/1984 | Delfino et al. | 437/982 |
| 4,902,631 | 2/1990 | Downey et al. | 437/7 |
| 5,104,482 | 4/1992 | Monkowski | 437/982 |
| 5,169,800 | 12/1992 | Kobayashi | 437/173 |

FOREIGN PATENT DOCUMENTS

| | | | |
|---|---|---|---|
| 41776 | 12/1981 | European Pat. Off. | 437/982 |
| 60-196960 | 10/1985 | Japan | 437/982 |
| 2294053 | 12/1990 | Japan | 437/982 |

*Primary Examiner*—Tom Thomas
*Assistant Examiner*—Kevin M. Picardat
*Attorney, Agent, or Firm*—Staas & Halsey

[57] ABSTRACT

A thermal planarization method of a surface of conducting layers for interconnects in high-density integrated circuits. When a conducting layer having an insulating layer with steps or grooves underneath is heated in a vacuum chamber, the surface is irradiated by an energy beam such as a He-Ne laser and a change of the reflective intensity followed by melting or planarizing of the conducting layer is monitored in real time basis, in situ. The monitored signal is electrically fed back quickly to a temperature controller to control a heating condition so that failure in planarizing a conducting layer due to insufficient heating, or coagulation or even evaporation of the layer due to excessive heating can be avoided.

17 Claims, 7 Drawing Sheets

METHOD FOR PRODUCING CONDUCTING LAYERS FOR A SEMICONDUCTOR DEVICE

BACKGROUND OF THE INVENTION

1. Field of the Invention

The present invention relates to a method for planarizing conducting layers for a semiconductor device, and in particular, to a method for planarizing metal or metal-silicide layers used for interconnect layers between the active or passive elements in a semiconductor integrated circuit.

2. Description of the Prior Art

In a semiconductor integrated circuit, a plurality of active or passive elements in a semiconductor substrate are electrically interconnected to each other using conducting layers such as a layer of aluminum compound metal with copper and silicon. These conducting layers are usually formed by means of vacuum evaporation or sputtering, whereby the deposited layers generally have poor step-coverage. This results in frequent disconnection of interconnect layers in subsequent thermal processes. The disconnection problem becomes increasingly significant for higher density of semiconductor integrated circuits. This problem could be solved by planarizing the deposited conducting layers. In an attempt to eliminate poor step-coverage and thus minimize this problem, a technique has been developed for planarizing the deposited conducting layers by heating and melting them for mass-flow as shown in FIGS. 1 (a) and (b), which is described in Japanese Unexamined Patent (Kokai) No. S63-236345. FIG. 1(a) shows a cross-sectional view of a semiconductor integrated circuit, particularly, an as-deposited conducting layer 54 on a via hole 53 formed in an insulated layer 52 on a semiconductor substrate 51, having poor step-coverage especially on the side-walls. FIG. 1(b) also shows a cross sectional view of a planarized conducting layer 54S by melting it to flow into a via hole 53, achieving a perfect planarity of the surface with a conducting plug in a steep via hole. The term "a via hole" as used herein is intended to include a vertical hole which connects the single crystal and polysilicon of the active areas of a device to a first layer of conducting material, and which connects a first layer of conducting material to a second layer of conducting material, second a to third, a etc. A conducting layer deposited to crossover an insulated interconnect already deposited and patterned on another insulating layer is also simultaneously planarized but is not as shown. However, in the conventional planarizing process, completion of planarization can be recognized only by observing surfaces of a conducting layer after heating is completely terminated. The optimum heating condition is usually determined after several trials by changing both temperature and time for heating. The problem is that a discrepancy in temperature between conducting layer surfaces and the substrate due to a time-lag in thermal conduction leads to excess or insufficiency of heating which often results in coagulation of a molten conducting layer as liquid droplets or even evaporation, or in contrast, failing to planarize it because of non-melting. In either ease, lack of stability in the planarizing process degrades reliability of interconnects of high-density semiconductor integrated circuits. Thus one of the major advantages of the thermal planarizing process is severely compromised.

SUMMARY OF THE INVENTION

It is a primary object of the present invention to provide a reliable method for producing interconnects of high-density semiconductor integrated circuits by heating a conducting layer without coagulation, evaporation, or failure in melting.

It is another object of the present invention to provide a reliable method for producing interconnects of high-density semiconductor integrated circuits by controlling heating conditions in real time basis in situ during thermal planarizing processes without time-consuming trials to determine the optimum heating condition in advance.

It is a further object of the present invention to provide a reliable method for producing interconnects of high-density semiconductor integrated circuits by plugging conducting materials in via holes, as well as planarizing a conducting layer simultaneously to form both lateral and vertical structures for multilayered interconnects.

It is a feature of the present invention that in a thermal planarizing process for a conducting layer deposited on a surface having steps and grooves, the surface of the conducting layer is irradiated by an energy beam and its reflective intensity is monitored in real time basis in situ during a heating operation.

It is another feature of the present invention that in a thermal planarizing process for a conducting layer deposited on a surface having steps and grooves, an electrical signal of the monitored reflective intensity is feedback to a temperature controller to control heating conditions in real time basis quickly by responding to any physical change of a conducting layer.

It is a further feature of the present invention that in thermal planarizing process for a conducting layer deposited on a surface having steps and grooves, the monitored reflective intensity is compared with that of a surface of good planarity as control, and as soon as any decrease of reflective intensity is monitored, which indicates melting or fluidity, the heating condition is quickly controlled so that the temperature of the surface is sustained for a certain period of time without a further elevation of temperature until planarization is accomplished.

It is a still further feature of the present invention that in a thermal planarizing process for a conducting layer deposited on a surface having steps and grooves, shortly after the monitored reflective intensity decreases abruptly, if it increases gradually up to the same extent as that of the molten conducting layer on a surface of originally good planarity, which indicates that planarization is accomplished, heating is immediately terminated.

It has been experimentally confirmed that the reflectivity of an energy beam such as a light which is incident on a conducting layer deposited on a surface of originally good planarity abruptly decreases substantially as soon as melting occurs when the surface temperature of the conducting layer increases gradually. Therefore, an occurrence of melting can be easily recognized by simply detecting a reflectivity change caused by phase transition from solid to liquid. Furthermore, since beam intensity monitored with a finite solid angle in the same reflective angle as an incident one on a conducting layer deposited on a surface of poor planarity also depends upon the surface morphology, completion of planarizing a conducting layer deposited on a surface of poor planarity also can be recognized by detecting coincidence of the above reflective intensity with that of the molten conducting layer on a substrate surface of originally good planarity.

According to the thermal planarization method of a conducting layer in the present invention, a surface of the conducting layer for interconnects in high-density integrated circuits is irradiated by an energy beam such as He-Ne laser and then the reflective intensity is monitored in real time basis, in situ, during a heating operation. Thereby, melting or planarizing of the conducting layer can be easily detected by monitoring a change of the reflective intensity and then its electrical signal is immediately feedback to a temperature controller so as quickly to control an operating temperature. As a result, failure in planarizing the conducting layer due to insufficient heating, or coagulation or even evaporation of the layer due to excessive heating can be prevented and eventually the planarization is performed without failure. Thus, the thermal planarization method of a conducting layer according to this invention is particularly suitable for use in manufacturing highly reliable interconnects in high-density integrated circuits.

The above and other objects and features of this invention will become apparent from the following description read in conjunction with the figures in which:

DESCRIPTION OF THE PREFERRED EMBODIMENTS

Referring to FIGS. 1(a) through 6, the basic process of this invention is explained hereafter.

Figure 2:
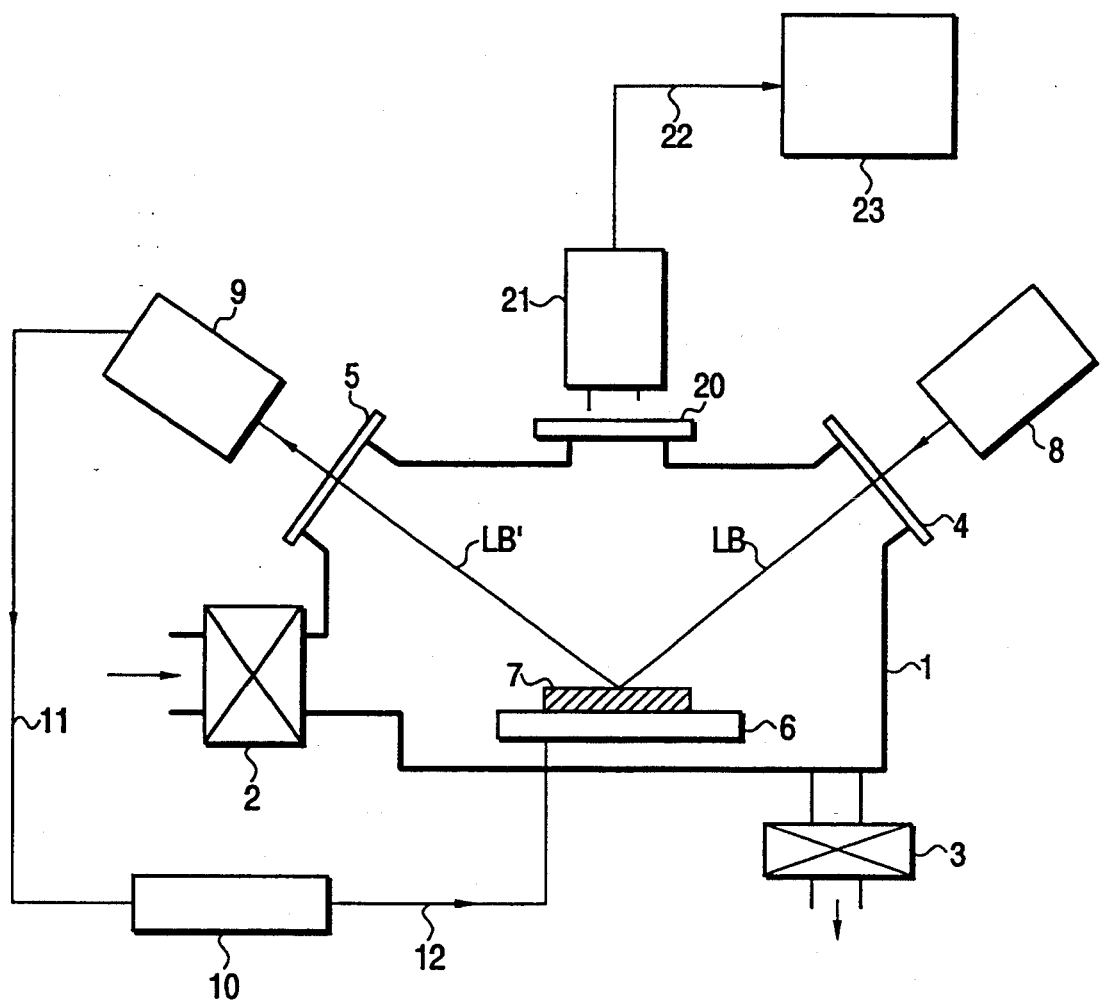
FIG. 2 is a side view illustrating partially in cross-section an embodiment of a heating operation system according to this invention.

Referring to FIG. 2, in the first step, an oxidized semiconductor wafer 7 deposited by a roughly 0.6~1 $\mu$m thick aluminum layer is loaded on an XY stage 6, preheated to a temperature of about 530° C. by a built-in heater of the XY stage in a vacuum chamber 1 through a wafer-inlet 2 having a loadlocked mechanism connected to sputtering equipment which is not shown. The chamber 1 is kept at a pressure of about $10^{-6} \sim 10^{-7}$ Torr by evacuating through gas-outlet 3, and then the wafer is irradiated by a He-Ne CW laser beam LB, having a power of 0.1 W, a beam-spot of 2 $\mu$m in diameter, through a window 4, from a laser beam generator 8, and then the intensity of the reflected beam LB′ through a window 5 is monitored in real time basis by a powermeter 9, while the heater temperature is increased gradually to 550°~600° C. by a temperature controller 10. Thereby, the aluminum layer is indirectly heated to melting by heating the substrate by means of the heater of the XY stage 6.

Figure 3:
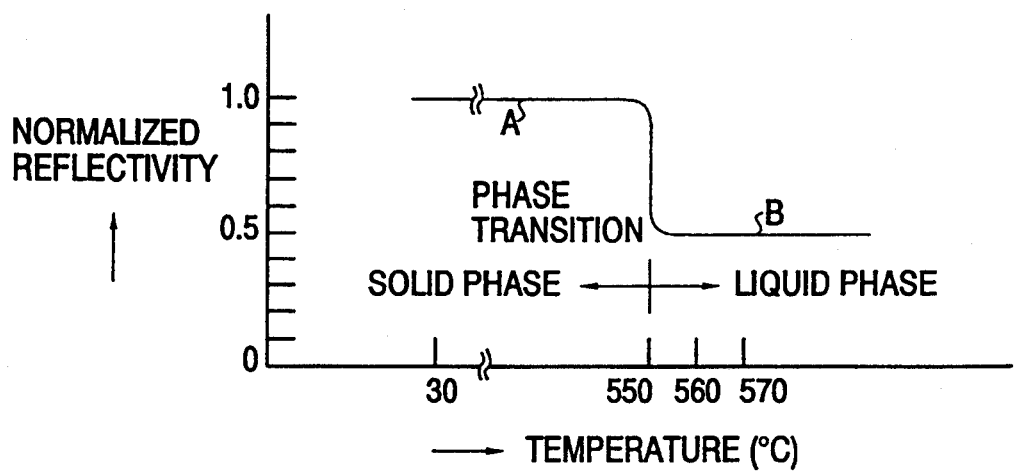
FIG. 3 is a graphic relationship between a normalized reflectivity change and the phase transition from solid to liquid in a conducting layer deposited on a surface of originally good planarity.

Referring to FIG. 3, when the intensity of a beam reflected on the aluminum layer on the substrate having a surface of originally good planarity is monitored by powermeter 9 during increasing substrate temperature, it generally goes down to about 50% in conjunction with a phase transition from solid denoted by A to liquid denoted by B. Thus, as soon as a sudden decrease in intensity of a reflected laser beam occurs, its electrical signal 11, referring to FIG. 2 again, is immediately feedback to a temperature controller 10 to decrease the heating power 12 so as to sustain the temperature for a certain period of time until planarization of a conducting layer can be accomplished.

Figure 1B:
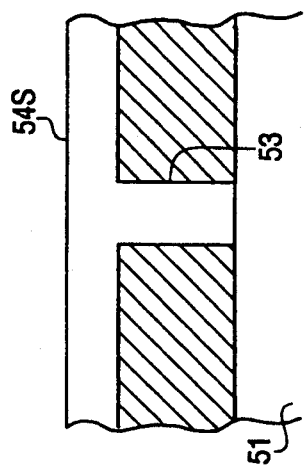
FIG. 1 (a) and (b) are cross-sectional views of a wafer before and after planarization of a conducting layer of poor planarity deposited on a via hole.
Figure 1A:
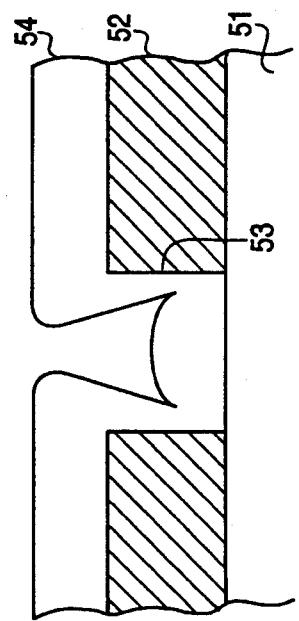
Figure 5:
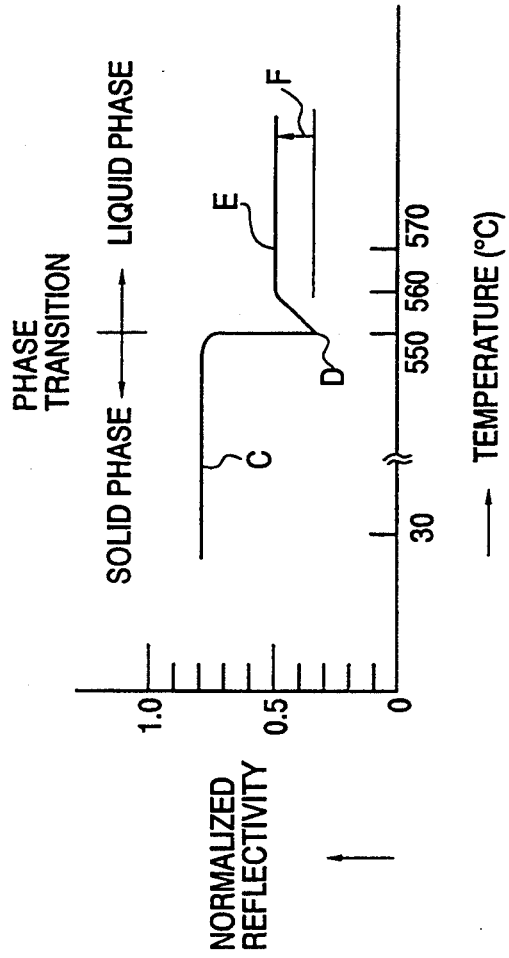
FIG. 5 is a graphic relationship between a normalized reflectivity change and the phase transition from solid to liquid in an aluminum layer deposited on a via hole according to this invention.
Figure 4A:
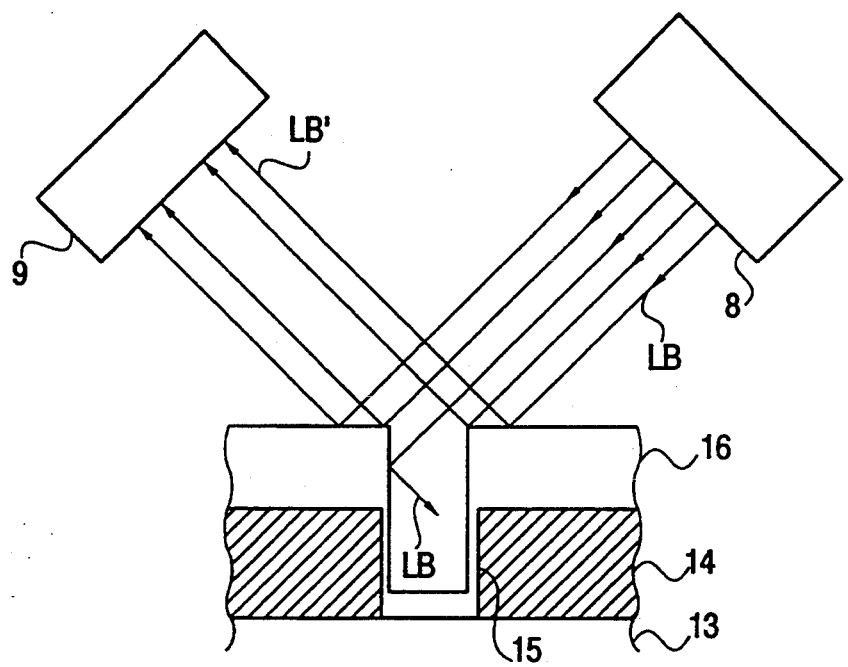
FIGS. 4 (a) and (b) are cross-sectional views of a wafer with a conducting layer deposited on a via hole for illustrating a principle of detecting the surface morphology according to this invention.
Figure 4B:
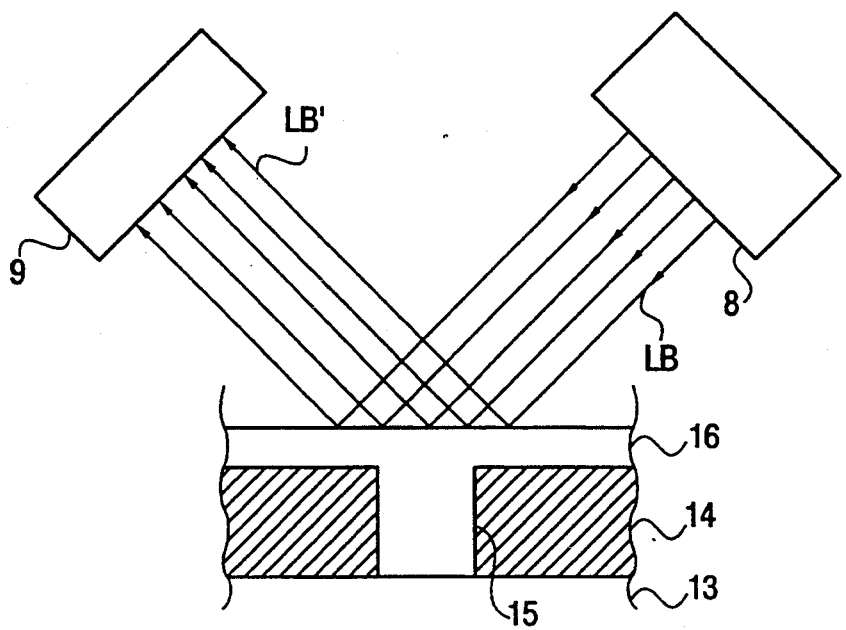

Referring to FIGS. 4(a) and (b), a schematic view of another embodiment illustrates a principle of detecting the surface morphology, wherein it will be shown in detail thereafter to distinguish the difference in intensity of a reflected beam between before and after planarizing a conducting layer on a surface having a step and a groove like a via hole. Referring to FIG. 5, a graphic illustration of a relationship between the intensity of a reflected beam and a phase transition of aluminum will be also explained in detail hereafter concerning this embodiment.

In this embodiment, the same planarization system as before can be used. As shown in FIG. 4(a), for instance, a via hole 15 of 1 $\mu$m in diameter is formed in an insulating layer 14 on silicon substrate 13, whereon a 1 $\mu$m thick aluminum layer 16 is deposited by either an evaporation or a sputtering method. An incident beam LB emitted from a laser beam generator 8, whereof a spot diameter is chosen large enough to cover a via hole 15, hits the aluminum layer 16 with an inclining incident angle, for example, 45° to normal and the intensity of its reflected beam LB′ is monitored with the same angle as the incident one by a powermeter 9 installed in a symmetrical position to the beam generator. It is thereby quite clear as illustrated that the intensity of a beam reflected mostly on a planar part of the surface with a via hole can be monitored.

Referring to FIG. 5, the above situation corresponds to the "C" region in the reflectivity curve. In the next step, as the aluminum layer 16 is heated gradually to reach a molten state, the intensity of the reflected beam goes down by half, which also corresponds to by "D" region. Subsequently, sustaining the temperature until a mass transfer takes place in the aluminum layer 16, results in filling a via hole 15 completely with molten aluminum and planarizing the surface. Since the mass transfer improves the surface morphology of the aluminum layer 16, the monitored intensity of reflected beam LB′ goes up slightly (denoted by "F" in FIG. 5) to a saturated value (denoted by "E" in FIG. 5), which also corresponds to the "B" region shown in FIG.3. In this stage, a completion of planarization of the conducting layer to terminate the planarization process can be confirmed.

Figure 6:
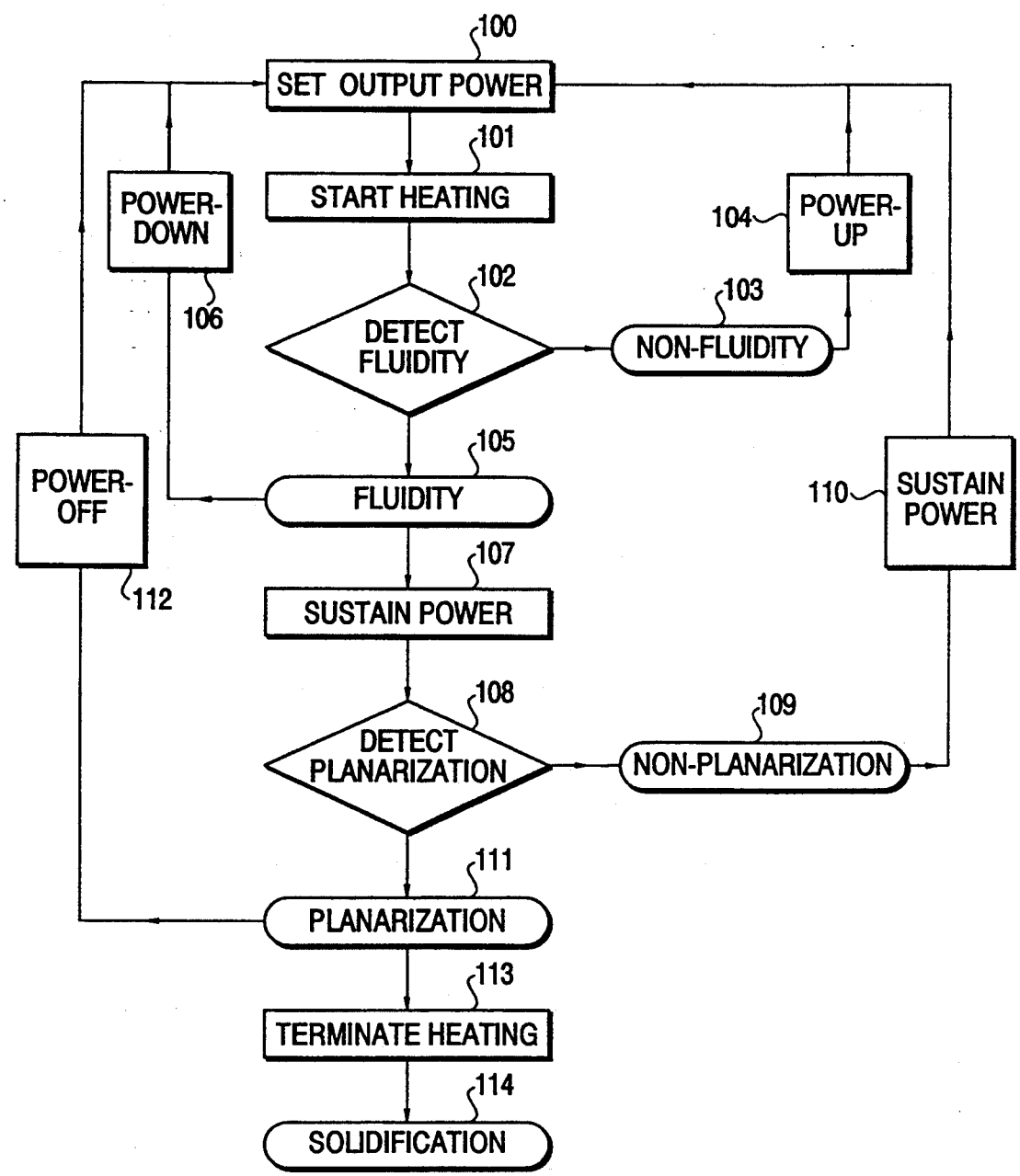
FIG. 6 is a flow chart of the planarization process of a conducting layer according to this invention.

By way of example, the logical operations that can be performed by a computer installed in the temperature controller to achieve the objects of the present invention are shown in FIG. 6. Shortly after heating starts in operation 101, the electric signal from the powermeter 9 constantly interrogates the "fluidity" signal already stored in the temperature controller to determine whether or not the conducting surface has been in a fluid state in operation 102, which leads to the result of either 103 or 105. If the interrogation indicates "fluidity", the next operations take place in 106 and subsequently 107, wherein the heating power goes down and sustains as it is. In the next interrogation 108, the completion of planarization of the conducting layer already in a fluid state is determined, the result of 109 or 111 are feedback to power operation of 110 or 112 depending on the above result. If the planarization has been done in a result 111, termination of heating takes place to solidify the conducting film.

Figure 7:
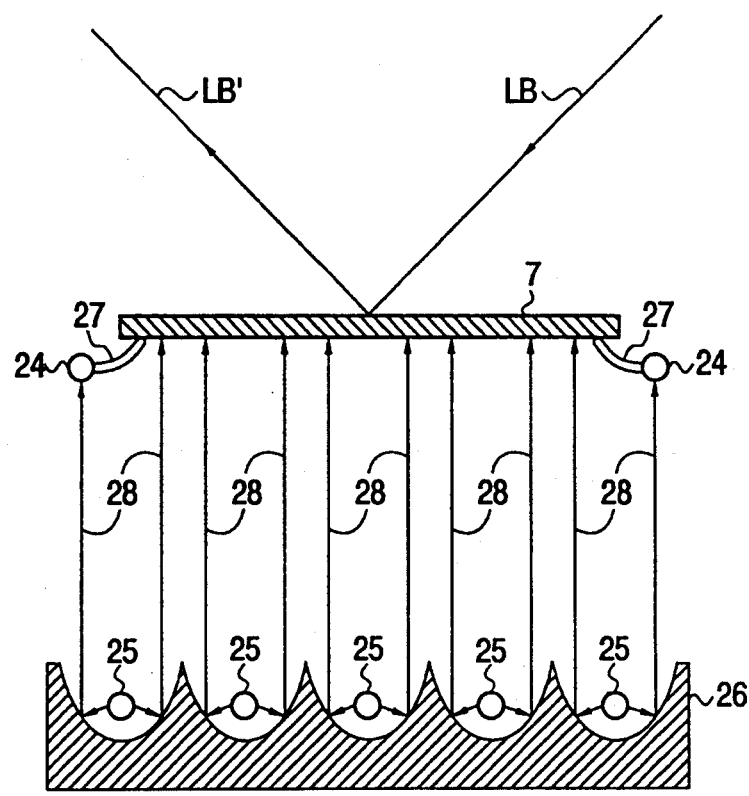
FIG. 7 is a cross-sectional view of a heating system in another embodiment according to this invention.

The embodiment disclosed in FIG. 7 is the same as that previously described except that in this figure the methods for holding and heating a substrate wafer are different from those which have been described. As shown herein, the substrate wafer 7 is held by a fused quartz ring-shaped holder 24 having three small rods 27 pointing toward the center of the ring. Rod lamps 25 are located under the wafer and ring in parallel to each other with a reflector 26. The lamps are preferably rod-like lamps, such as halogen or inert-gas filled tungsten lamps or mercury lamps. The reflector has also preferably parabolic semicylindrical reflective mirrors for each lamp with a water-cooling system. Thereby, a wafer is uniformly heated from its back surface by parallel radiation beams 28. The major advantage of this radiation heating method over the heated XY-stage method in the previous embodiment is a faster response of the feedback signal to temperature control. The radiation energy of lamps can change quickly responding to an electrical signal from the temperature controller, thereby the substrate temperature also can change quickly without either overshoots or undershoots.

Figure 8A:
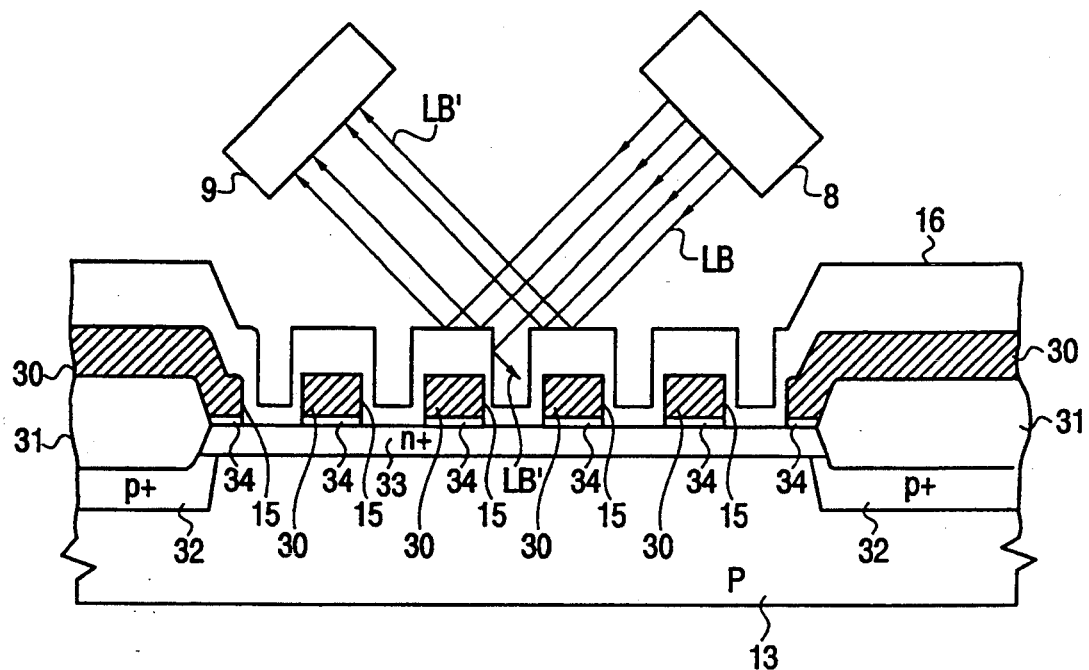
FIGS. 8(a) and (b) are cross-sectional views of a monitored area in a further embodiment before and after planarization of a conducting layer according to this invention.
Figure 8B:
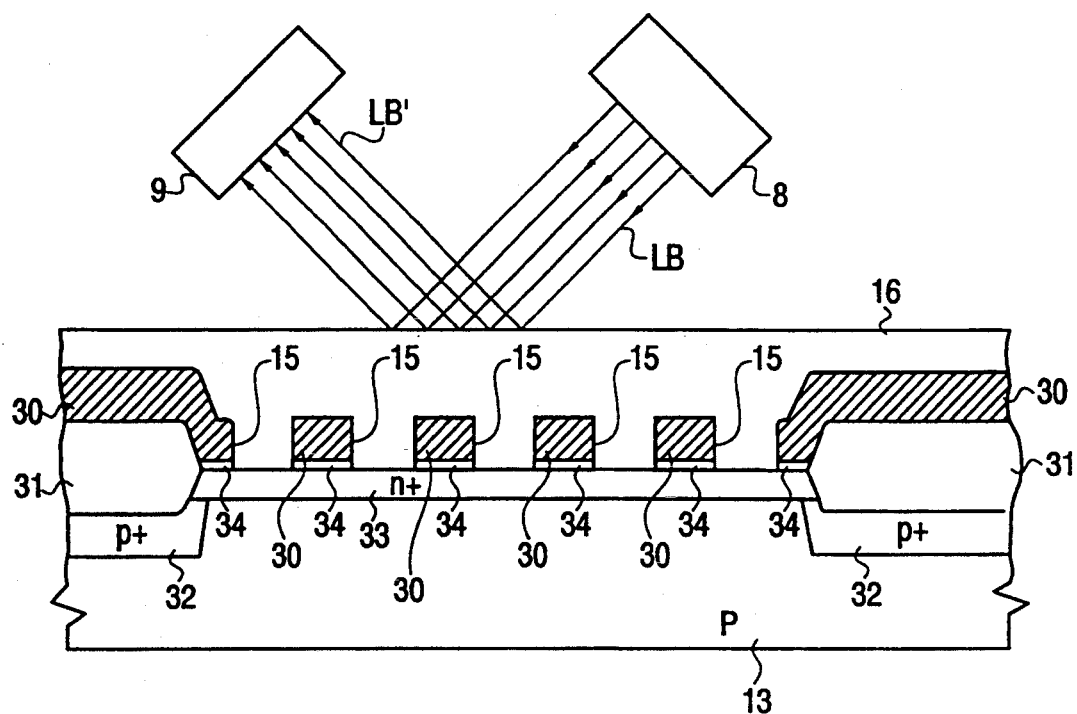

The preferred embodiment of the present invention for a monitored area on the surface of an MOS integrated circuit is illustrated in FIGS. 8(a) and (b). Since in an actual integrated circuit, sizes and density of via holes are different either place to place in a chip or chip to chip, it is a time-consuming matter to search and align a single via hole to a laser beam. Another problem is an adjustment of the diameter of an incident laser beam to a via hole. Thus in this embodiment, there is a particular area provided on the same chip as an MOS integrated circuit, wherein a half of the area consists of a dense array of via holes, for example, 1 $\mu$m $\times$ 1 $\mu$m opening and 1 $\mu$m separation, the other half consists of a planar surface area (as a control). Both of them occupy, for example, 10 $\mu$m $\times$ 10 $\mu$m areas, which are irradiated by a laser beam of 2 $\mu$m in diameter. Thereby, a laser beam can hit the via-hole area more easily, and the difference in intensity of a reflected beam between before and after planarization of a conducting layer can be detected more efficiently. Since a wafer surface is observed by a CCD camera 21 through a window 20 with monitor TV 23 as shown in FIG. 2, the above irradiated area can be easily aligned to a laser beam by XY stage operation.

Figure 9A:
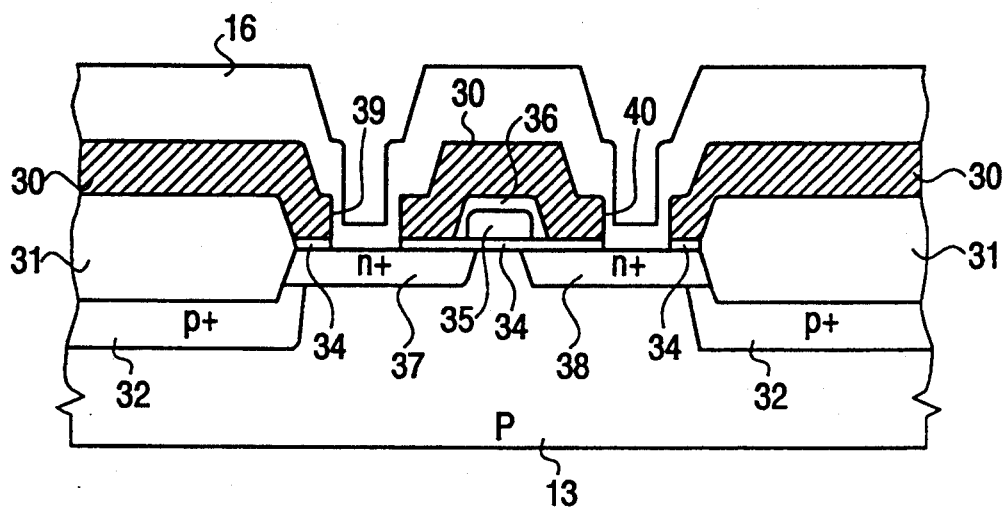
FIGS. 9(a) and (b) are cross-sectional views of an MOSFET in a semiconductor integrated circuit before and after planarization of a conducting layer according to this invention.

FIGS. 9(a) and (b) are the preferred embodiment of this invention applied to an MOS integrated circuit.

Referring to FIG. 9(a), first, a 1 $\mu$m thick thermal oxide layer 31 is selectively formed with a channel stop layer 32 of p + type diffusion for an isolation element on the surface of a p type silicon substrate 13. Next, a 400 nm thick gate oxide layer 34 is thermally grown on the bare silicon surface, whereon a gate electrode 35 is formed with a thin oxide layer 36 on it. An n + type diffusion layer for self-aligned source and drain regions 37 and 38 are formed respectively by a conventional ion implantation method and subsequent annealing. A 1 $\mu$m thick phospho-silicate glass (PSG)layer 30 is deposited on the entire surface by a conventional CVD method, and then via holes 39 and 40 are formed in the source and drain regions 37 and 38 respectively. After annealing for PSG reflow, a 1 $\mu$m thick aluminum layer 16 is formed all over the wafer surface a vacuum evaporation method, wherein the layer should not have any discontinuities particularly in the vicinity of steps and grooves. Otherwise, the layer will be often coagulated without planarization when heated.

Figure 9B:
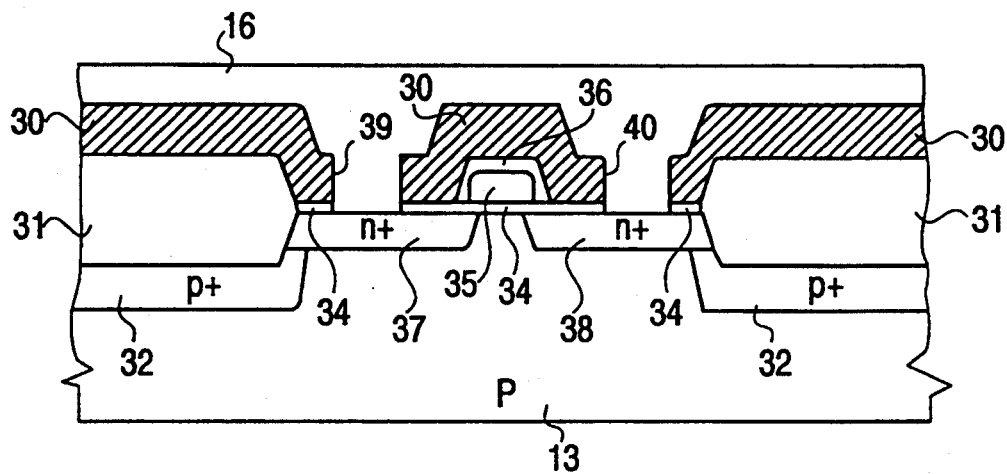

Referring to FIG. 9(b), thereafter, the thermal planarization operation of a conducting layer according to the present invention is carried out and consequently a completely planarized aluminum layer 16 isobtained is illustrated. The wafer fabrication process for the MOS integrated circuit, thereafter is completed by patterning the aluminum layer 16 to form the electric interconnect and subsequent deposition of another PSG layer for passivation.

Referring to FIGS. 8(a) and (b), it should be noticed that the monitored area shown in FIGS. 8(a) and (b) can be simultaneously formed by the same wafer fabrication process as that for the MOSFET described above.

According to the thermal planarization method of a conducting layer described in the above embodiment of the present invention, a surface of the conducting layer for interconnects in high-density integrated circuits is irradiated by an energy beam such as an He-Ne laser beam and then the reflective intensity is monitored in real time basis, in situ, during a heating operation. Thereby, melting or planarizing of a conducting layer can be easily detected by monitoring a change of the reflective intensity and then its electrical signal is immediately feedback to a temperature controller so as to quickly control an operating temperature. As a result, failure in planarizing a conducting layer due to insufficient heating, or coagulation or even evaporation of the layer due to excessive heating can be avoided and eventually the planarization is performed with high reliability. Thus, the thermal planarization method of a conducting layer according to this invention is particularly suitable for use in manufacturing highly reliable interconnects in high-density integrated circuits.

Although the embodiment has been described in detail in connection with a the thermal planarization method of an aluminum layer, it should be recognized that the invention is not limited to this metal. Other examples of a conducting layer to which the invention may be applied are a silicon contained aluminum, a silicon and copper contained aluminum and other conducting materials which can melt or be fluidified by heating.

The present invention can also be realized by using an Ar laser, a ruby laser, and also an ion beam and an electron beam, etc, as the high energy beam.

What is claimed is:

1. A method for producing an interconnect layer on an insulating layer having steps or grooves under said interconnect layer, said insulating layer being formed on a surface of a semiconductor substrate, comprising the steps of:
   (a) forming a layer of a conducting material, capable of being fluidified when heated on and contouring said steps or said grooves of said insulating layer, to leave no discontinuity at least in the region of said steps or said grooves of said insulating layer;
   (b) heating said layer of said conducting material to a fluid state;
   (c) irradiating said layer of said conducting material at least in the region having said steps or said grooves of said insulating layer by an energy beam and monitoring an intensity of the reflected energy beam in a real time basis in situ during said heating; and
   (d) controlling heating power during said heating to permit said layer of said conducting material to be planarized in conjunction with changes of said intensity of said reflective energy beam.

2. The method according to claim 1, wherein step(d) further comprises controlling said heating power so as to sustain the temperature of said layer of said conducting material in conjunction with detecting an abrupt decrease in said intensity of said reflective energy beam.

3. The method according to claim 1, wherein step(d) further comprises controlling said heating power so as to solidify said layer of said conducting material in conjunction with detecting an increase in said intensity of said reflective energy beam gradually to reach a certain saturated value.

4. The method according to claim 3, wherein said saturated value is the same as the intensity in the reflective energy beam on said layer of said conducting material in a fluid state formed on the insulating layer having a surface of originally good planarity.

5. The method according to claim 1, wherein step(c) further comprises providing a particular area on said layer of said conducting material to be irradiated.

6. The method according to claim 5, wherein said particular area comprises an area providing said layer of said conducting material on said layer of said insulating material having a plurality of steps and grooves similar to those contained in the semiconductor integrated circuit.

7. The method according to claim 5, wherein said particular area comprises an area providing said layer of said conducting material on said insulating layer having a surface of originally good planarity.

8. The method according to claim 1, wherein said conducting material is selected from the group consisting of aluminum, silicon contained aluminum, silicon and copper contained aluminum, and other conducting materials which can melt or be fluidified by heating.

9. The method according to claim 1, wherein said energy beam is selected from the group consisting of a He-Ne laser, an Ar laser, a ruby laser, an ion beam and an electron beam as the high energy beam.

10. The method according to claim 1, wherein said layer of said conducting material is heated indirectly by heating said substrate.

11. The method according to claim 1, wherein said heating temperature is high enough to melt or fluidify said layer of said conducting material while also low enough not to significantly redistribute impurities in diffusion layers already formed in said substrate.

12. The method according to claim 1, wherein said heating source comprise rod-like lamps, each located at a focal line of respective parabolic semicylindrical reflecting mirrors.

13. The method according to claim 1, wherein said heating source is located at an opposite side of said substrate to that on which said layer of said conducting material is formed.

14. The method according to claim 1, wherein said heating is carried out uniformly on said entire surface of said substrate.

15. The method according to claim 1, wherein said grooves comprise via holes formed in source and drain diffusion regions in an MOS integrated circuit.

16. The method according to claim 5, wherein said particular area to be monitored is formed simultaneously by the same wafer fabrication process as that for said semiconductor integrated circuit on said chip.

17. The method according to claim 5, wherein said particular area to be monitored comprises a dense array of via holes, each being the same in shape and depth as that in said semiconductor integrated circuit on said chip.

* * * * *

UNITED STATES PATENT AND TRADEMARK OFFICE
CERTIFICATE OF CORRECTION

PATENT NO. : 5,366,905
DATED : November 22, 1994
INVENTOR(S) : RYOICHI MUKAI

It is certified that error appears in the above-indentified patent and that said Letters Patent is hereby corrected as shown below:

Column 1, line 48, change "second a third, a etc." to --a second to a third, etc.--;

line 52, delete "as";

line 64, change "ease" to --case--.

Column 2, line 31, change "feed" to --fed--.

Column 3, line 14, change "feedback" to --fed back--;

line 29, change "FIG." to --FIGS.--.

Column 4, line 24, change "feedback" to --fed back--;

line 59, change "by" to --the--.

UNITED STATES PATENT AND TRADEMARK OFFICE
CERTIFICATE OF CORRECTION

PATENT NO. : 5,366,905
DATED : November 22, 1994
INVENTOR(S) : RYOICHI MUKAI

It is certified that error appears in the above-indentified patent and that said Letters Patent is hereby corrected as shown below:

Column 5, line 19, change "feedback" to --fed back--;

line 29, change "Rod" to --Rod-like--.

Column 6, line 20, change "tinuities" to --tinuities,--;

line 26, change "isobtained is" to

--is obtained as--;

line 46, change "feedback" to --fed back--;

line 57, delete "the".

Column 8, line 25, changed "comprise" to --comprises--.

Signed and Sealed this

Twenty-third Day of May, 1995

Attest:

BRUCE LEHMAN

Attesting Officer

Commissioner of Patents and Trademarks